US008647723B2

(12) United States Patent
Kongkanand et al.

(10) Patent No.: US 8,647,723 B2
(45) Date of Patent: Feb. 11, 2014

(54) NUCLEATION OF ULTRATHIN, CONTINUOUS, CONFORMAL METAL FILMS USING ATOMIC LAYER DEPOSITION AND APPLICATION AS FUEL CELL CATALYSTS

(75) Inventors: Anusorn Kongkanand, Rochester, NY (US); Frederick T. Wagner, Fairport, NY (US); Steven M. George, Boulder, CO (US); Layton Baker, Boulder, CO (US)

(73) Assignee: GM Global Technology Operations LLC, Detroit, MI (US)

( * ) Notice: Subject to any disclaimer, the term of this patent is extended or adjusted under 35 U.S.C. 154(b) by 37 days.

(21) Appl. No.: 13/247,534

(22) Filed: Sep. 28, 2011

(65) Prior Publication Data

US 2012/0100301 A1    Apr. 26, 2012

Related U.S. Application Data

(60) Provisional application No. 61/405,855, filed on Oct. 22, 2010.

(51) Int. Cl.
*C23C 14/02* (2006.01)
*H05H 1/24* (2006.01)

(52) U.S. Cl.
USPC ........................................ 427/569; 427/248.1

(58) Field of Classification Search
None
See application file for complete search history.

(56) References Cited

U.S. PATENT DOCUMENTS

| 6,498,097 B1* | 12/2002 | Park et al. ...................... 438/686 |
| 2002/0122972 A1* | 9/2002 | Klitsner et al. .................. 429/42 |
| 2003/0017715 A1* | 1/2003 | Muller et al. .................. 438/763 |
| 2003/0194598 A1* | 10/2003 | Chan ............................... 429/40 |
| 2004/0211357 A1* | 10/2004 | Gadgil et al. ................... 117/84 |
| 2005/0064098 A1* | 3/2005 | Elers et al. ..................... 427/250 |
| 2006/0093848 A1* | 5/2006 | Senkevich et al. ............ 428/585 |

OTHER PUBLICATIONS

Goldstein, et al., Surface poisoning in the nucleation and growth of palladium atomic layer deposition with Pd(hfac)2 and formalin, Thin Solid Films, (2011), doi: 10.1016/j.tsf.2011.02.037, pp. 1-9.

* cited by examiner

*Primary Examiner* — Joseph Miller, Jr.
(74) *Attorney, Agent, or Firm* — Dinsmore & Shohl LLP (57) ABSTRACT

A method to achieve a conformal ultrathin film of platinum or one of its alloys on a substrate that can be economically used as a heterogeneous catalyst, such as automotive polymer electrolyte membrane (PEM) fuel cell catalyst. The method includes using a hydrogen plasma in platinum atomic layer deposition along with tungsten as a substrate or anchoring adhesive layer to assist platinum nucleation and deposition.

17 Claims, 5 Drawing Sheets

NUCLEATION OF ULTRATHIN, CONTINUOUS, CONFORMAL METAL FILMS USING ATOMIC LAYER DEPOSITION AND APPLICATION AS FUEL CELL CATALYSTS

STATEMENT OF RELATED CASES

This application claims the benefit of Provisional Application Ser. No. 61/405,855, filed Oct. 22, 2010, entitled Nucleation Of Ultrathin, Continuous And Conformal Metal Films Using Atomic Layer Deposition And Application As Fuel Cell Catalysts, which is incorporated herein by reference.

FIELD OF THE INVENTION

The present invention relates generally to a method to prepare a conformal thin film of platinum or one of its alloys onto a substrate, and more particularly to reduce the cost associated with depositing platinum as a catalyst in a fuel cell.

BACKGROUND OF THE INVENTION

In a typical fuel cell configuration, an electrolyte is sandwiched between electrodes (specifically, an anode and a cathode) such that positive ions generated at the anode flow through the electrolyte and react with negative ions generated at the cathode, while current generated by the flow of free electrons produced at the anode during the oxidation of the anode reactant and consumed at the cathode during the reduction of the cathode reactant can be used to power one or more external devices. Collectively, the anode and cathode, which are typically made of a porous carbon-based substrate material, are called electrodes. Such porous construction and relatively low-cost material allows wet gas permeation, provides a high surface area reaction surface against the electrolyte, is non-corrosive and is conductive to the free electrons that flow between the electrodes. Together, the electrolyte and the electrodes make up what is commonly referred to as the membrane electrode assembly (MEA). One form of fuel cell, called the proton exchange membrane or polymer electrolyte membrane (PEM) fuel cell, is particularly well-suited for vehicular and related mobile applications, as the solid polymer electrolyte (which is typically made from a plastic-like film of a perfluorosulfonic acid, such as Nafion®) is of a robust, relatively simple construction that can operate at relatively low temperatures.

Figure 1:
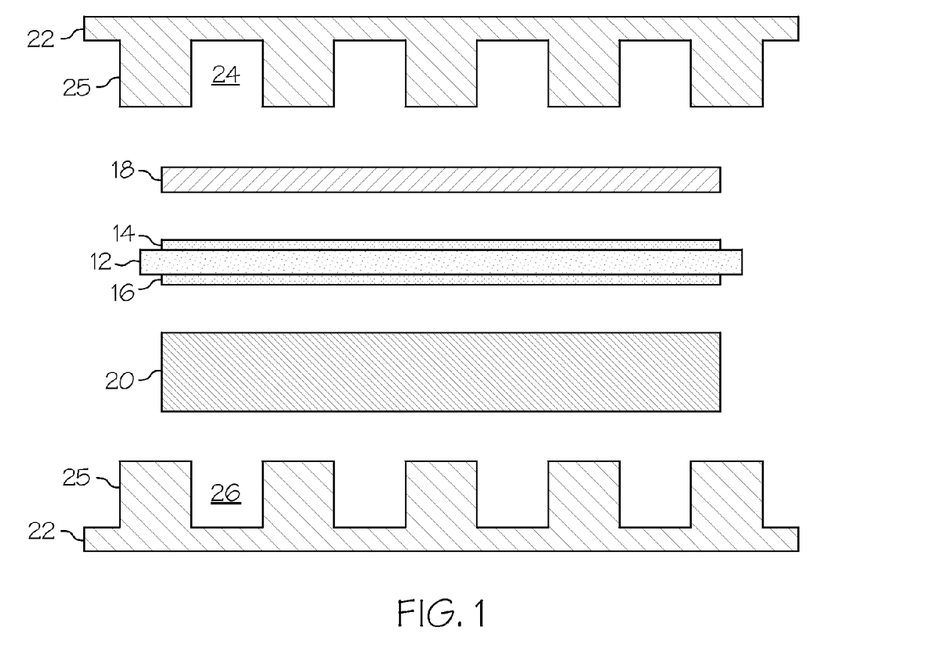
FIG. 1 is a partially exploded, sectional view of a portion of a PEM fuel cell stack.

An exploded, sectional view of a portion of a PEM fuel cell stack is shown in FIG. 1. It includes the MEA made up of the proton exchange membrane 12 sandwiched between an anode catalyst layer 14 and a cathode catalyst layer 16. In addition, an anode diffusion layer 18 and a cathode diffusion layer 20 are placed in an adjacently facing relationship to the MEA such that the anode catalyst layer 14 and a cathode catalyst layer 16 provide substantial surface contact with both the proton exchange membrane 12 and the respective diffusion layers 18, 20. As stated above, the diffusion layers 18, 20 form a high surface area catalytically active substrate. For example, these can be made of refractory metal oxides, activated carbon, graphite or the like. Bipolar plates 22 engage the anode diffusion layer 18 and the cathode diffusion layer 20, and include lands 25 that separate adjacent sections of reactant gas flow channels 24, 26. In a general (although not necessary) form, the cathode diffusion layer 20 may be thicker than the anode diffusion layer 18 to make it more difficult for water vapor to travel quickly through the thickness of the layer. This in turn produces a water vapor concentration gradient within the cathode diffusion layer 20 to maintain the proton exchange membrane 12 in a sufficiently hydrated state.

To facilitate the ionization of the respective anode and cathode fuels in PEM fuel cells, a noble metal catalyst is deposited on the surface of the electrodes. Platinum (Pt) is the most common example of such a catalyst, and due to its high electrocatalytic activity, stability and electrical conductivity, it provides a ready chemical reaction site without being consumed in the process. Unfortunately, platinum is very expensive, so the amount used is a significant portion of overall fuel cell cost. Consequently, one of the major challenges facing the commercial application of fuel cells is the reduction in the amount of platinum used.

The sluggish kinetics of an oxygen reduction reaction (ORR) at the cathode, particularly at low temperatures, require that a large amount of platinum be used. Moreover, in order to maximize the catalytic activity, the platinum is generally fabricated as very fine particles. The particle size for catalysts deemed most appropriate for vehicular use is typically between about 2 and 5 nanometers (nm) in diameter. The small particle size allows these catalysts to achieve a high specific surface area (i.e., the active platinum area per mass of platinum). However, as the particles become very small (for example, smaller than about 2-3 nm), both the ORR activity and the durability deteriorate in a phenomenon known as the platinum particle size effect. This is often ascribed to the increase in low coordination number surface atoms on the kinks and edges of the particles. The small particle size makes the particles susceptible to area loss during use via platinum dissolution and redeposition, (Ostwald ripening).

A continuous platinum film provides higher stability against dissolution. Moreover, a platinum film gives higher specific ORR activity per unit surface area of platinum compared to platinum as nanoparticles. For example, low-platinum catalysts take advantage of the observation that large, smooth surfaces of bulk platinum give 5 to 10 times the ORR activity of platinum nanoparticles when normalized per surface platinum atom. The problem with large, smooth platinum surfaces is that the vast majority of the atoms are buried beneath the surface. The growth of smooth, very thin platinum layers (e.g., less than 10 monolayers, or 2.2 nm) on a smooth, inexpensive substrate could produce catalysts that provide high activity per surface platinum atom as seen for large bulk platinum electrodes and a sufficiently high proportion of the total platinum atoms residing on the surface to give a high activity per mass of platinum used.

However, growing continuous metal films at such a small thickness has posed great challenges. When platinum is deposited on most substrates, it usually forms a three-dimensional cluster in order to maintain its extraordinary high surface energy (about 2.5 J/m$^2$).

Atomic layer deposition (ALD) is a technique for the deposition of thin metal films based on sequential, self-limiting surface reactions. The ideal characteristics of ALD are atomic layer control of the thin film thickness and conformality on the underlying substrate. Many ALD systems display these ideal characteristics. One important example is Al$_2$O$_3$ ALD using trimethylaluminum and water. Al$_2$O$_3$ ALD can deposit extremely conformal films on high aspect substrates, as well as on nanoparticles.

Metal ALD has developed rapidly, and many metals can now be deposited using ALD, including important catalytic metals such as platinum and ruthenium (Ru). One difficulty that has been observed for some metal ALD systems is the inability to nucleate easily on some substrates, such as oxide substrates. For example, platinum ALD using reductive elimination chemistry with MeCpPtMe$_3$+O$_2$ as the reactants has nucleation difficulties on SiO$_2$ and Al$_2$O$_3$ substrates. No platinum ALD is observed for hundreds of ALD cycles, and when it can finally be observed, the deposition is in the form of nanoclusters. These nanoclusters may eventually grow together to form a continuous film after more ALD cycles.

The thickness at which the nanoclusters grow together to form a continuous film is much larger than 1 nm and probably larger than 5 nm, making them too thick for many ALD film applications. For example, the efficient use of expensive catalytic materials such as platinum is required in ultrathin thicknesses to reduce the cost. Thin layers of metals in various structures are also required for magnetic multilayers. For proper operation, the thicknesses of these metal layers need to be less than the thickness at which the metal layers become continuous.

The difficulty for the nucleation of metals on many substrates such as oxide surfaces is the large difference between the surface energy of the metal and the surface energy of the substrate. Metals such as platinum have large surface energies on the order of about 2.5 J/m$^2$. Oxide supports such as Al$_2$O$_3$ have much lower surface energies, for example, about 1.8 J/m$^2$. The result is that the metals will sinter into nanoclusters if they have sufficient surface mobility to reduce their surface energy. The surface energy is minimized because a three-dimensional metal nanocluster has a lower surface area than a two-dimensional metallic film containing the same number of atoms as the nanocluster that covers the underlying substrate.

One solution to the difficulty of metal nucleation is to deposit the metal onto a substrate that has a much higher surface energy than the metal itself. In this case, the metal will want to form a two-dimensional continuous film on the underlying substrate because such a deposition geometry will reduce the surface energy. The extremely high surface energy of tungsten (~3.5 J/m$^2$) is such that platinum deposited on tungsten would be expected to form two-dimensional continuous films on the underlying tungsten substrate.

Tungsten-based ALD can nucleate rapidly on Al$_2$O$_3$ ALD substrates. Such a structure is performed using WF$_6$ and Si$_2$H$_6$ as the reactants, where under optimized conditions, a continuous and ultrathin tungsten ALD film can be obtained on Al$_2$O$_3$ ALD at a thickness of only 2.5 nm. On the basis of surface energies, this tungsten ALD film should sinter and form nanoclusters on the Al$_2$O$_3$ ALD surface. However, the tungsten ALD surface chemistry is very exothermic and can be performed at low temperatures. At these low temperatures, the tungsten atoms have very low surface mobility and do not sinter to form nanoclusters.

SUMMARY OF THE INVENTION

The present invention provides a method to prepare a conformal thin film platinum or platinum alloy for use as a catalyst on a substrate as a way to reduce the costs of fuel cells while maintaining platinum integrity. The specific atomic layer deposition methods of this invention enable growth of continuous platinum layers with the desired low thickness, as well as increase the gain in activity. As such, the method of the present invention promotes two-dimensional film-like growth rather than three-dimensional clustering. Furthermore, because platinum and its alloys are extremely useful heterogeneous catalysts, the invention may also be used to coat platinum onto different shapes and substrates

BRIEF DESCRIPTION OF THE DRAWINGS

The following detailed description of specific embodiments can be best understood when read in conjunction with the following drawings, where like structure is indicated with like reference numerals and in which.

DETAILED DESCRIPTION OF THE INVENTION

The deposition methods of this invention enable the growth of continuous Pt layers with the desired low thickness.

One embodiment of the invention involves a procedure for depositing a tungsten ALD adhesion layer and related nucleation of ultrathin and conformal platinum ALD film. A continuous tungsten ALD metal film on Al$_2$O$_3$ ALD can be used as an adhesion layer to facilitate the nucleation of ultrathin, continuous and conformal metal ALD films.

Tungsten (W) can be used as a substrate or as an anchoring adhesive layer to assist platinum nucleation and deposition. Tungsten has a higher surface energy (for example, approximately 3.5 J/m$^2$) than platinum, good electrical conductivity, and is chemically stable. The high surface energy assists the nucleation of platinum and prevents early three-dimensional growth. Tungsten particles can be used as a substrate to form a tungsten/platinum core-shell structure, or they can be coated onto another foreign particle as an adhesive layer to form core-shell along with the platinum and substrate.

Figure 2:
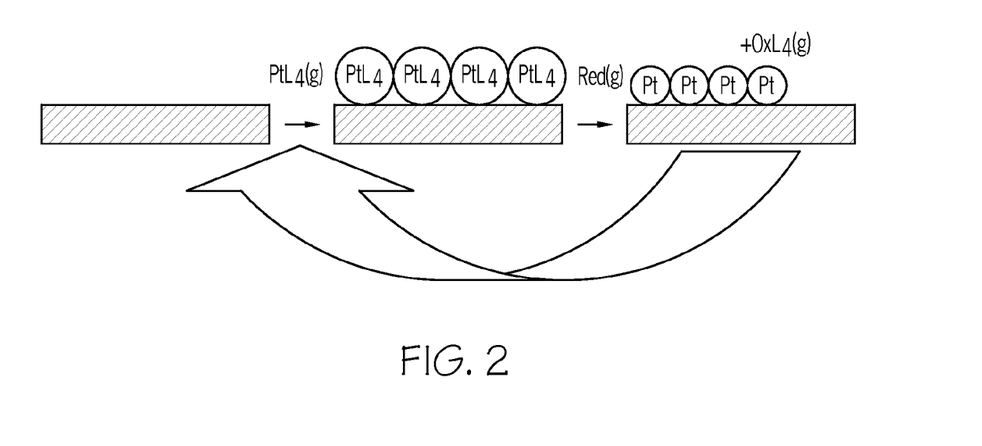
FIG. 2 is an illustration showing generally how a platinum ALD thin film is built up.

ALD allows excellent atomic layer control. FIG. 2 is an illustration of the platinum ALD process. In an earlier study on Palladium (Pd) ALD using Pd(hfac)$_2$ and formalin as the reducing agent, we found that the hfac ligands of the Pd precursor adsorb on the surface and impede further Pd deposition. This study showed that other factors, besides surface energy, can be responsible for the slow nucleation of metal ALD on oxide substrates. Similar phenomenon was found on Pt ALD when formalin was used as the reducing agent . D. N. Goldsteing, S. M. George, "Surface poisoning in the nucleation and growth of palladium atomic layer deposition with Pd(hfac)$_2$ and formalin," Thin Solid Films (2011) doi: 10.1016/j.tssf.2011.02.037. Oxygen (O$_2$) or hydrogen (H$_2$)-plasma ALDS were found to be effective in removing ligand poisoning and achieving thicker films. H$_2$-plasma ALD can also be used to ensure that the tungsten surface is in a reductive metallic state, where it provides maximum surface energy and good adhesion for platinum nucleation or deposition. A model study of a H$_2$-plasma ALD deposited platinum on a tungsten-coated silicon (Si) wafer demonstrated that a continuous thin film of platinum can be prepared successfully with a platinum thickness as thin as about 1.0 to about 1.5 nm; such thicknesses were verified by X-ray reflectometry (XRR) and X-ray photoelectron spectroscopy (XPS).

The general procedure is described below, assuming an initial oxide substrate.

1. Deposit a metal oxide, such as $Al_2O_3$, on the underlying oxide substrate. $Al_2O_3$ ALD has the ability to grow very effectively on all oxide substrates.
2. Deposit W ALD on the metal oxide ALD adhesion layer. Approximately 8-10 W ALD cycles are required to form a continuous and conformal tungsten ALD film with a thickness of about 2.5 nm.
3. Clean the W ALD substrate using a $H_2$ plasma. The W ALD surface is left with either $WF_x$ or $WSiF_xH_y$ surface species after the $WF_6$ or $Si_2H_6$ exposures, respectively. The W ALD adhesion layer is much more effective if the W ALD surface is clean and reduced to metallic tungsten.
4. Prevent the W ALD surface from oxidation to $WO_3$. Oxidation of the tungsten ALD surface will change the surface energy and minimize the benefit of the high surface energy W surface. A $H_2$ plasma can be used to reduce the oxidized W surface back to metallic W.
5. Perform metal ALD on the W ALD adhesion layer using $H_2$ plasma-assisted metal ALD. Metal ALD using thermal chemistry may be able to grow on the W ALD adhesion layer. However, the best nucleation and growth will be obtained using $H_2$ plasma-assisted metal ALD. The $H_2$ plasma can react with metal organometallic or metal halide precursors on the surface to perform the metal ALD surface chemistry. The $H_2$ plasma can also keep the underlying W ALD surface from oxidizing if there is residual $O_2$ or $H_2O$ in the reactor or by oxidizing as a result of reacting with the ligands on the metal precursors.

If the substrate is W (or other metal), rather than an initial oxide substrate, then the process would start with cleaning the W (or other metal) substrate and reducing any native oxide on the W (or other metal) surface.

The deposition of the metal oxide may not be necessary. However, W ALD using $WF_6$ and $Si_2H_6$ nucleates and grows very readily on $Al_2O_3$ ALD surfaces. W ALD also nucleates fairly well on $SiO_2$ surfaces. However, $SiO_2$ ALD is much more difficult to deposit using ALD methods. Other metal oxides could also be used, such as $TiO_2$.

The metal to be deposited in step 2 should have a higher surface energy than Pt, which is about $2.5\ J/m^2$. W has a much higher surface energy of $3.3-3.6\ J/m^2$. Other metals that have a higher surface energy than Pt include, but are not limited to, Re ($3.6\ J/m^2$), Ir ($3.0\ J/m^2$), Ta ($2.9-3.1\ J/m^2$), Ru ($3.0\ J/m^2$) and Mo ($2.9-3.0\ J/m^2$). W is a preferred metal because the W ALD process is well established, and it nucleates well on $Al_2O_3$ ALD surfaces. Mo ALD has been developed using $MoF_6+Si_2H_6$, and it is also preferred. A similar chemistry for Re ALD is also possible using $ReF_6+Si_2H_6$. The ALD of Ru, Ir, and Ta have also been developed using other chemistries. However, their nucleation may not be efficient on metal oxide substrates.

W ALD is preferred using $WF_6$ and silanes or boranes such as $Si_2H_6$, $SiH_4$ and $B_2H_6$ as the reactants. $Si_2H_6$ is preferred as the reactant with $WF_6$. Approximately 8-10 W ALD cycles are required to form a continuous and conformal W ALD film with a thickness of 2.5 nm.

ALD is the preferred deposition method for the W (or other metal) layer. Other deposition methods, such as chemical vapor deposition (CVD) and physical vapor deposition (PVD) may also work. However, CVD and PVD will not yield as smooth a deposited metal film as ALD.

Any reduction method which can convert the metal oxide to metal can be used to clean the metal. For example, to convert $WO_3$ to W, $H_2$ plasma is preferred. Other reducing plasmas such as $NH_3$ might also be used. In addition to plasmas, $H_2$ gas at a high enough temperature might also work. Other reducing gases may also convert $WO_3$ to W. In addition, the $WO_3$ native oxide layer could also be removed by sputtering.

For example, $H_2$ plasma cleaning and/or preventing oxidation steps can be performed using a radio frequency (RF) inductively coupled plasma (ICP) (e.g., Litmus Blue ICP Plasma source from Advanced Energy). The $H_2$ plasma exposures were performed using $H_2$ pressure of about 0.5 Torr, an ICP RF power of about 500 W, and about 5 second plasma exposure times.

Any method of reducing the metal oxide to the metal can be used to prevent oxidation. Suitable methods are discussed above.

The Pt or Pt alloy is deposited in the last step. For ease in processing, metal ALD using thermal chemistry would be preferred to metal ALD using plasma chemistry. However, the Pt ALD using plasma chemistry is known to nucleate more effectively than Pt ALD using thermal chemistry. There is a possibility that Pt ALD using higher $H_2$ pressures may be able to nucleate and grow as well as Pt ALD using $H_2$ plasma. The $H_2$ plasma-assisted metal ALD process is likely to yield the most rapid nucleation which will lead to the thinnest conformal and most continuous metal film, and is thus the preferred process.

Figure 3A:
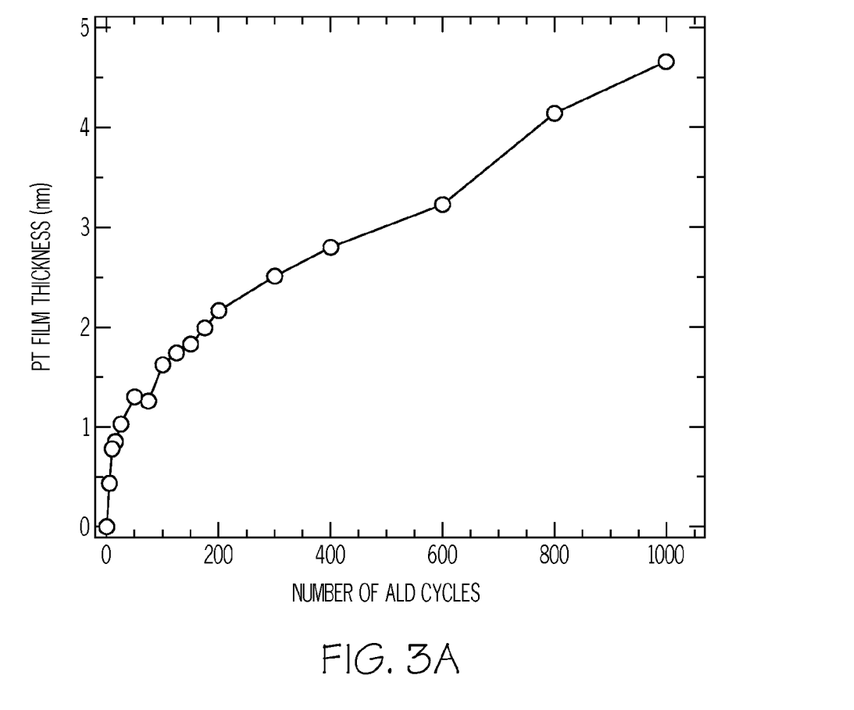
FIG. 3A-B show platinum film nucleation and growth on a tungsten substrate based on the number of ALD cycles.
Figure 3B:
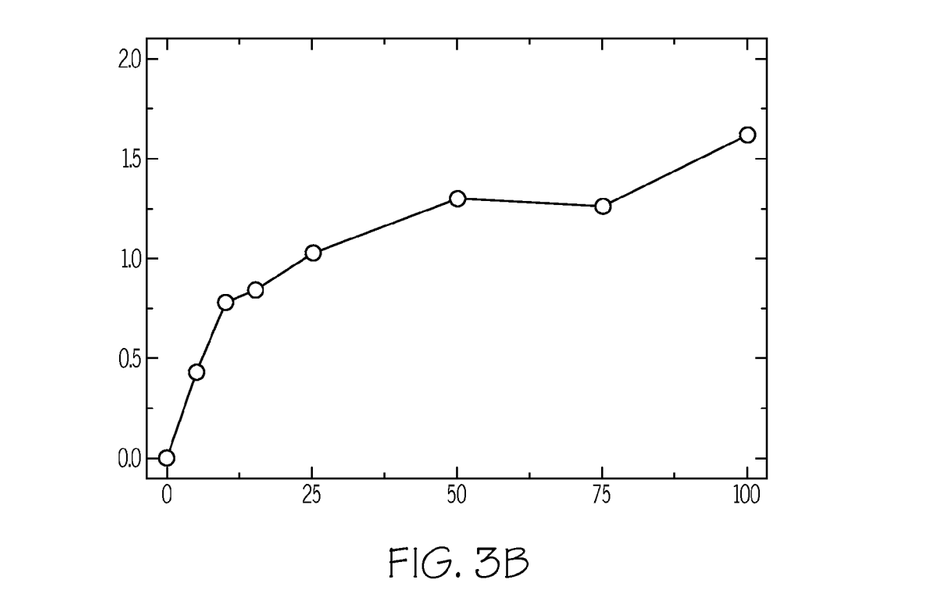

The general procedure was demonstrated using platinum ALD using $MeCpPtMe_3+H_2$ plasma as the reactants. The $H_2$ plasma was formed using a inductively coupled plasma (ICP) source. The resulting films were analyzed using a variety of techniques, including XRR (which can measure film thickness and film density) and XPS. FIGS. 3A-B show the platinum film thickness on tungsten ALD using XRR analysis. The platinum ALD film nucleates and grows immediately (i.e., beginning with very few ALD cycles) on the underlying tungsten ALD substrate. FIGS. 3A-B also reveal that the platinum growth rate is reduced for larger platinum ALD film thicknesses. This indicates that the platinum ALD growth rate is different on the tungsten ALD substrate and the platinum ALD surface. The XRR analysis also obtains the density of the platinum ALD film. The measured densities are lower than bulk platinum until after 75 ALD cycles at a platinum ALD film thickness of 1.26 nm. Although not wishing to bound by theory, the lower densities for film thicknesses less than 1.26 nm may be caused by interfacial effects between tungsten and platinum crystal structures, or by a very thin PtO, layer at the interface.

Figure 4:
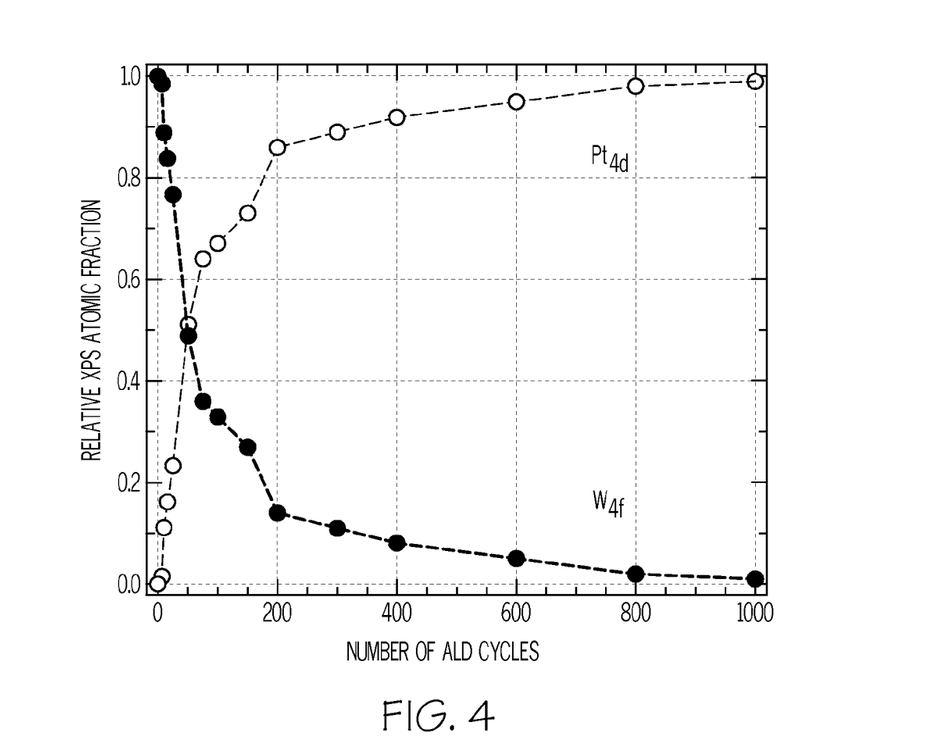
FIG. 4 shows the growth of platinum and the corresponding attenuation of tungsten under H$_2$-plasma assisted platinum ALD.
Figure 5:
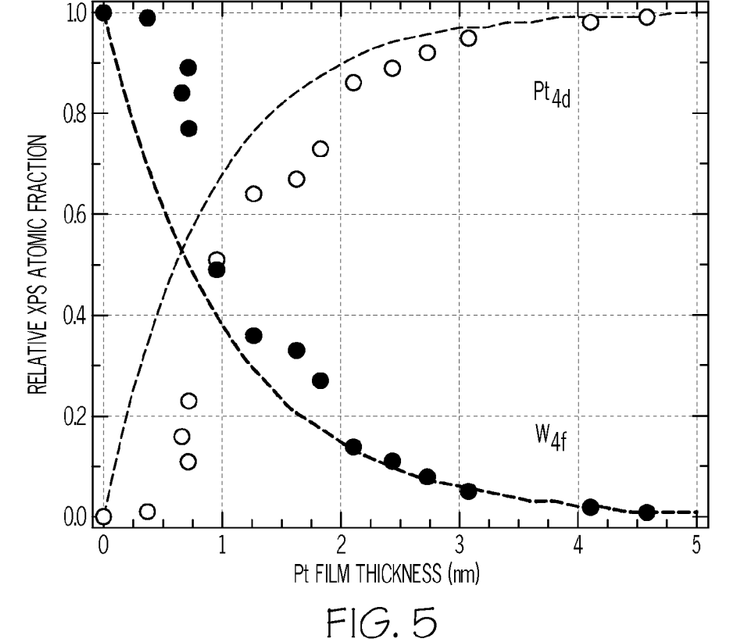
FIG. 5 shows the results of FIG. 4 versus platinum ALD film thickness, as well as predicted values from layer-by-layer growth models.

XPS studies also revealed the rapid and continuous growth of platinum ALD on the underlying tungsten ALD substrate. FIG. 4 shows the $Pt_{4d}$ XPS signal and the $W_{4f}$ XPS signal versus the number of platinum ALD cycles. The rapid growth of $Pt_{4d}$ XPS signal and the rapid corresponding attenuation of the $W_{4f}$ XPS signal are consistent with very facile nucleation of $H_2$-plasma assisted platinum ALD on tungsten ALD. The XPS results are presented versus platinum ALD film thickness in FIG. 5, where the dotted lines are obtained from layer-by-layer growth models. The close agreement between the XPS signals and the layer-by-layer growth model indicates that a continuous platinum ALD film is obtained at platinum ALD film thicknesses of between 1 and 2 nm.

Figure 6:
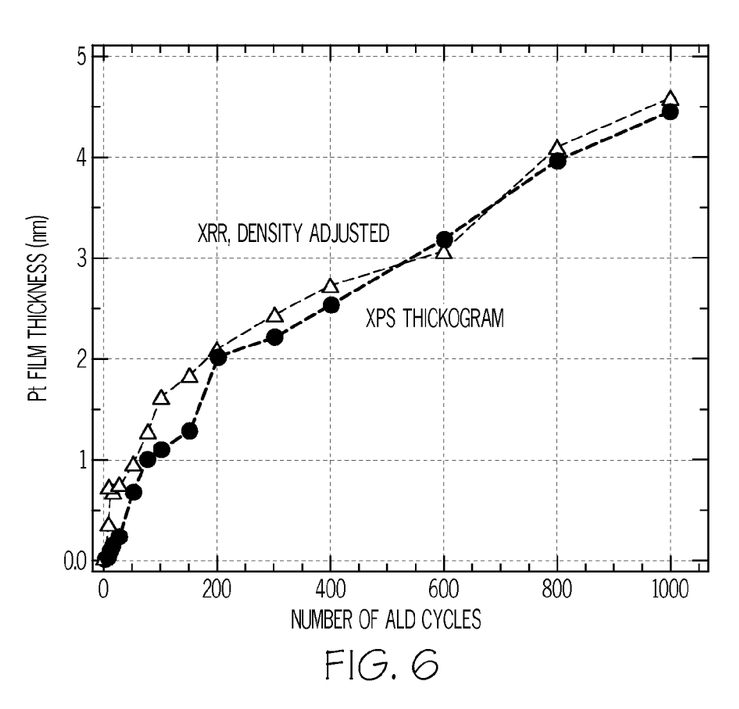
FIG. 6 compares platinum ALD film thicknesses obtained by XRR and XPS measurements.

FIG. 6 shows the excellent agreement between the platinum ALD film thicknesses obtained by the XRR and XPS measurements. A platinum ALD film with a thickness of between 1.0 and 1.5 nm is obtained after 100 ALD cycles. This platinum ALD film is continuous based on the layer-by-layer growth model. This platinum ALD film also has the density of bulk platinum based on the XRR analysis. Therefore, the XRR and XPS results show that continuous platinum ALD films with the bulk density of platinum can be obtained at thicknesses of between about 1.0 and 1.5 nm after 100 ALD cycles.

Electrocatalytic evaluation confirms the platinum-particle size effect on ORR, in which the activity per surface platinum atom decreases with a decrease in particle size. In fact, the significantly higher activity per surface platinum atom (i.e., as much as 5-fold to 10-fold) seen for large smooth platinum surfaces compared to platinum nanoparticles is an extreme case of this particle-size effect. It can be described as the "continuous-layer effect". The so-called nanostructured thin-film (NSTF) catalysts, provide a partially-developed example of the continuous layer effect. However, the state-of-art NSTF possesses approximately >5 nm thick Pt layer, limiting the electrochemically active surface area of the catalyst. This so far limits the Pt-mass-normalized oxygen reduction activities achieved by NSTF to those approximately comparable to conventional Pt/C or Pt alloy/C catalysts. The ALD methods of the present invention achieve a continuous layer effect with a platinum layer thin enough to improve the electrochemically active surface area, and hence giving improved activity per mass of platinum as well.

Figure 7:
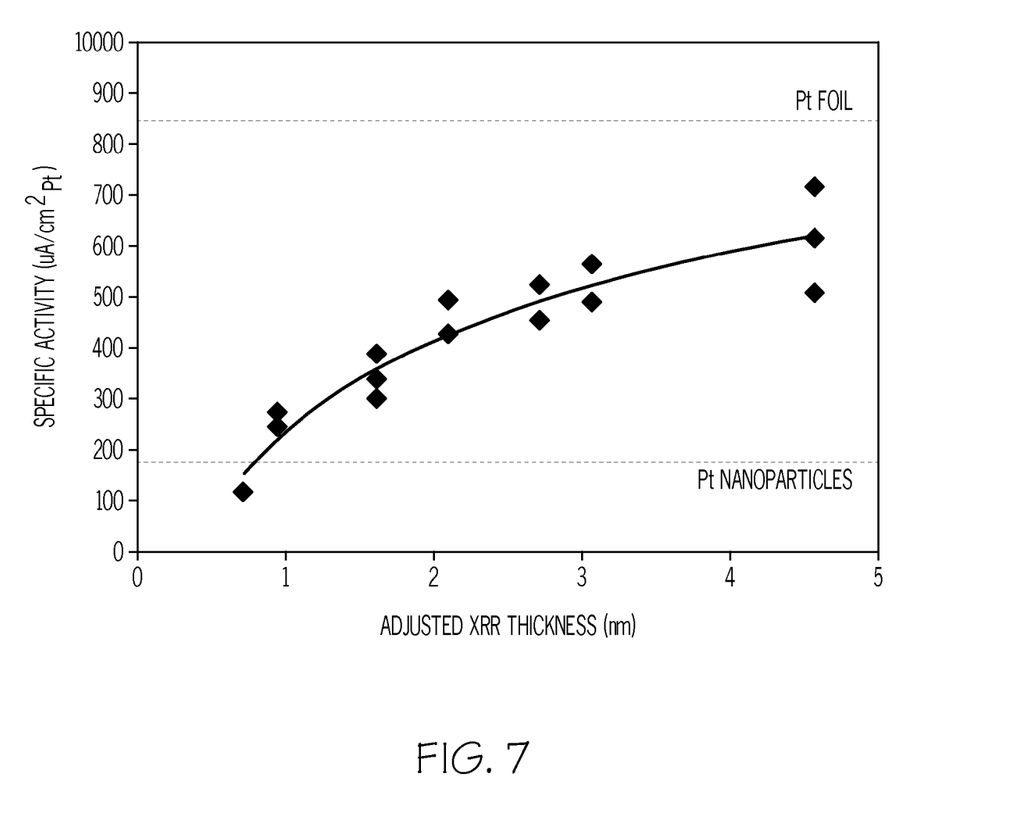
FIG. 7 shows the oxygen reduction electrocatalytic activities of platinum ALD on a commercially available tungsten/silicon substrate sample as a function of ALD deposition cycles.

Commercial 300 nm thick sputter-coated tungsten layers on silicon wafers were used as substrates, which had a significantly rougher surface than the W-ALD/Si wafer described earlier (about 2 $cm^2_w/cm^2_{geometric}$ compared to 1 $cm^2_w/cm^2_{geometric}$ for W-ALD/Si). The use of the thick tungsten layer ensured sufficient electrical conductivity for the accuracy of initial electrochemical measurements. The tungsten/silicon substrates were ALD-deposited with platinum following the procedure described above. Coulometric measurements of hydrogen electrosorption and the oxygen reduction activity of each Pt-ALD/W/Si electrode were evaluated in a thin channel flow cell to determine the electrochemical active platinum surface area. The measured activities were normalized to the measured platinum surface areas to obtain the area-specific activities. FIG. 7 shows the oxygen reduction electrocatalytic activities of platinum ALD on the W/Si substrate sample as a function of ALD deposition cycles. The dashed lines are specific activities obtained from polycrystalline Pt foil and nanoparticulate Pt/C catalysts. The catalytic activities were measured in 0.1 M $HCl_4$ aqueous electrolyte at 0.9 V vs. RHE at 25° C. The specific activities of the thinnest platinum ALD electrodes, before growth of continuous layers commenced, were comparable to those of platinum nanoparticles. As the platinum ALD grew in thickness, the activities approached that of the polycrystalline platinum foil. The platinum ALD samples at 2 to 3 nm thicknesses already showed activity enhancement by a factor of 2 to 3 compared to platinum nanoparticles. This result is indicative of the continuous layer effect. Although not wishing to be bound by theory, the lower increase in activity obtained here compared to what one would expect from a smooth surface of bulk platinum is perhaps due to the highly rough surface of the commercial W/Si substrates. The roughness factor ($cm^2_{Pt}/cm^2_{geometric}$) of 2.0 for the platinum ALD on the commercial thick-W/Si substrate was considerably higher than that of platinum foil (1.4), and is likely to limit the activity enhancement from the continuous layer. Atomic force microscopy of the commercial W/Si substrate showed a peak-to-peak roughness of about 20 nm. Activity evaluation of platinum ALD on smoother W/Si is underway, with expectations of still-higher activities.

The platinum layer is generally less than about 4 nm, or less than about 3.5 nm, or less than about 3 nm, or less than about 2.5 nm, or less than about 2.2 nm, or less than about 2 nm, or less than about 1.5 nm.

The number of ALD cycles used to deposit the platinum layer is generally less than about 1000, or less than about 800, or less than about 600, or less than about 400, or less than about 300, or less than about 250, or less than about 200, or less than about 175, or less than about 150, or less than about 125, or less than about 100. An ALD cycle is one exposure to the Pt-containing gaseous species, plus the exposure to other gases or plasmas needed to fix that dose of Pt on the surface as a metallic species.

Platinum ALD using hydrogen plasma and a tungsten adhesion layer can produce continuous platinum layers of approximately 2 nm thickness; considerably thinner than the minimum layer thicknesses required for continuity in films grown by other methods. Moreover, ORR activity testing shows that films grown by the present method exhibit much of the higher activity per surface platinum atom seen for smooth surfaces of bulk platinum electrodes. The combination of high activity per surface platinum atom and a high percentage of total platinum atoms being on the surface give these platinum ALD layers a high activity per total mass of catalyst used, thereby reducing the amount of platinum needed to form such layers as electrodes for fuel cells.

While certain representative embodiments and details have been shown for purposes of illustrating the invention, it will be apparent to those skilled in the art that various changes may be made without departing from the scope of the invention, which is defined in the appended claims.

What is claimed is:

1. A method of producing a fuel cell electrode, said method comprising:
   providing a porous carbon-based substrate material that is conductive to a free flow of electrons therethrough; and
   nucleating a metal film on said porous substrate material, said nucleating comprising:
   providing a layer of metal having a surface energy greater than about 2.5 J/m2 using at least one of ALD, CVD or PVD; and
   depositing a continuous, conformal layer of Pt or Pt alloy on the layer of metal using H2 plasma assisted ALD, the layer of Pt or Pt alloy having a thickness of less than about 4 nm such that said continuous, conformal layer of Pt or Pt alloy forms on said porous substrate material to define a catalytic surface of at least one of a fuel cell anode or a fuel cell cathode.

2. The method of claim 1 wherein the layer of metal is W, Re, Ir, Ta, Ru, or Mo.

3. The method of claim 1 wherein providing the layer of metal comprises depositing the layer of metal using $H_2$ plasma assisted ALD.

4. The method of claim 1 wherein the layer of metal is W.

5. The method of claim 1 further comprising removing metal oxides from the layer of metal.

6. The method of claim 5 wherein removing metal oxides from the layer of metal comprises exposing the layer of metal to a $H_2$ plasma.

7. The method of claim 1 wherein providing the layer of metal comprises:
   providing an oxide substrate;
   depositing a layer of metal oxide using ALD on the oxide substrate; and
   depositing the layer of metal on the layer of metal oxide.

8. The method of claim 7 wherein the metal oxide is $Al_2O_3$, $SiO_2$, or $TiO_2$.

9. The method of claim 1 wherein the thickness of the layer of Pt or Pt alloy is less than about 3 nm.

10. The method of claim 1 wherein the thickness of the layer of Pt or Pt alloy is less than about 2.5 nm.

11. A method of producing a fuel cell electrode, said method comprising:
   providing a porous carbon-based substrate material that is conductive to a free flow of electrons therethrough; and
   nucleating a metal film on said porous substrate material comprising:
      providing an oxide surface on said porous substrate material;
      depositing a layer of metal oxide using ALD on the oxide surface;
      depositing a layer of W on the layer of metal oxide using ALD; and
   depositing a continuous, conformal layer of Pt or Pt alloy using at least one of ALD, CVD, or PVD on the layer of W, the layer of Pt or Pt alloy having a thickness of less than about 4 nm.

12. The method of claim 11 wherein depositing a layer of W on the layer of metal oxide comprises depositing the layer of metal using $H_2$ plasma assisted ALD.

13. The method of claim 11 further comprising removing metal oxides from the layer of W.

14. The method of claim 13 wherein removing metal oxides from the layer of W comprises exposing the layer of W to a $H_2$ plasma.

15. The method of claim 11 wherein the metal oxide is $Al_2O_3$, $SiO_2$, or $TiO_2$.

16. The method of claim 11 wherein the thickness of the layer of Pt or Pt alloy is less than about 3 nm.

17. The method of claim 11 wherein the thickness of the layer of Pt or Pt alloy is less than about 2.5 nm.

* * * * *